Figure 1:
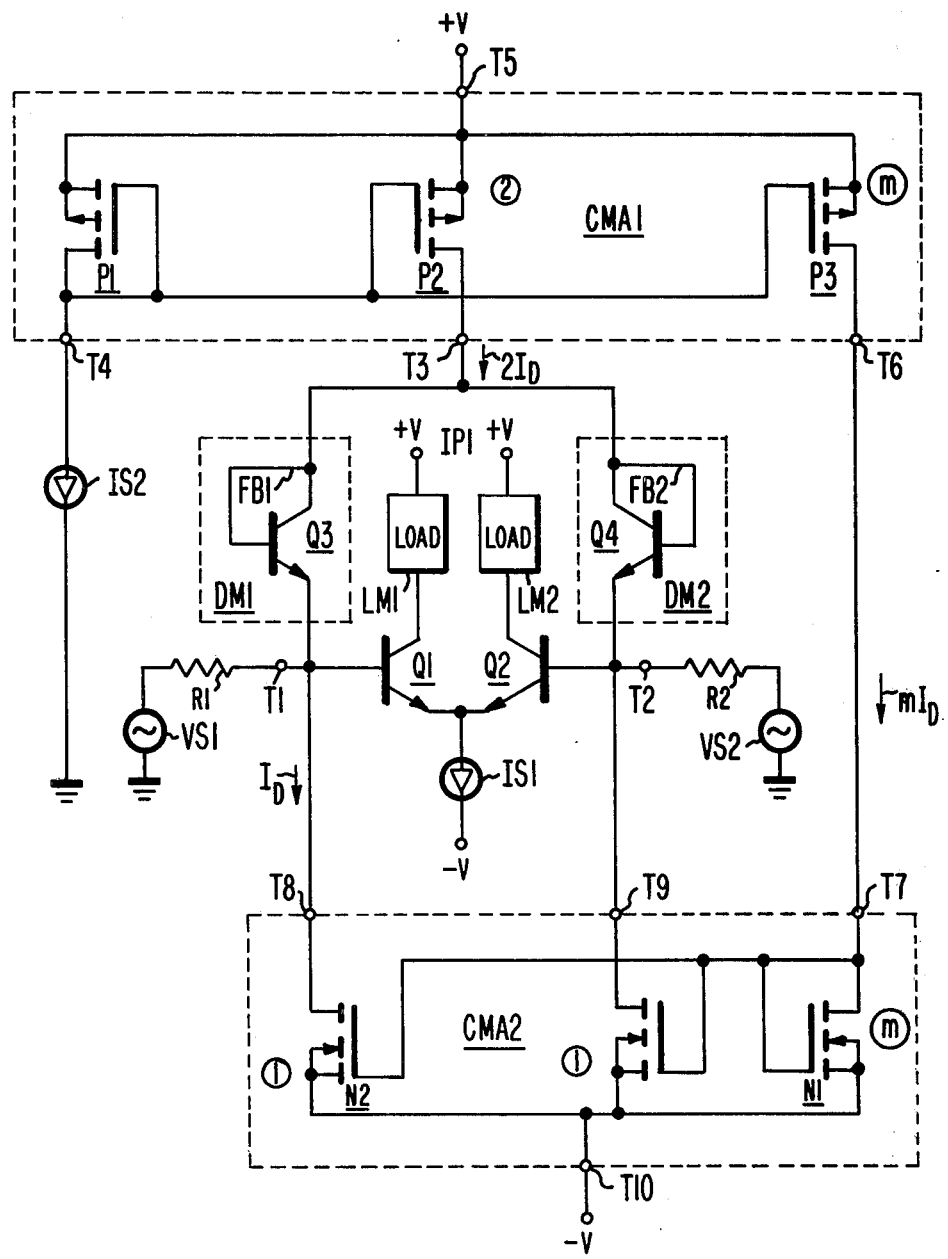

United States Patent [19]

Wittlinger

[11] 4,159,449
[45] Jun. 26, 1979

[54] LONG-TAILED-PAIR WITH LINEARIZATION NETWORK

[75] Inventor: Harold A. Wittlinger, Hopewell Township, Cumberland County, N.J.

[73] Assignee: RCA Corporation, New York, N.Y.

[21] Appl. No.: 915,311

[22] Filed: Jun. 14, 1978

[51] Int. Cl.² .............................................. H03F 3/45
[52] U.S. Cl. .................................. 330/257; 330/261
[58] Field of Search ................................ 330/257, 261

[56] References Cited

U.S. PATENT DOCUMENTS

| 3,689,752 | 9/1972 | Gilbert | 330/252 X |
| 3,931,583 | 1/1976 | Gilbert | 330/257 |
| 4,075,574 | 2/1978 | Gilbert | 330/257 |

Primary Examiner—Lawrence J. Dahl
Attorney, Agent, or Firm—H. Christoffersen; A. L. Limberg; E. P. Herrmann

[57] ABSTRACT

First and second transistors are connected in long-tailed-pair amplifier configuration, with interconnected emitter electrodes connected to a constant current generator that supplies the tail current. Input signals applied to the base electrodes of these transistors are predistorted by diodes connecting the base electrodes of the first and second transistors to a common node point. These diodes are provided forward bias currents from constant current generators, so they float with regard to common-mode components of the input signals and do not impair the common-mode signal rejection of the long-tailed-pair amplifier configuration.

8 Claims, 6 Drawing Figures

LONG-TAILED-PAIR WITH LINEARIZATION NETWORK

The present application relates to a linearization network for long-tailed-pair amplifier configurations.

A long-tailed-pair amplifier comprises first and second transistors having respective base electrodes for receiving first and second input signals sharing a common-mode component and differing from each other by a differential-mode component. The differential-mode component may be applied in single-ended fashion—that is to only one of the base electrodes—or in balanced fashion—that is, in equal anti-phase measures to the base electrodes. The emitter electrodes of the transistors have an interconnection therebetween to which a tail current is supplied or from which a tail current is withdrawn. Output signal responsive to the differential-mode components of the first and second input signals is taken from at least one of the collector electrodes of the transistors.

Gilbert in U.S. Pat. Nos. 3,689,752, 3,931,583 and 4,075,574 issued Sept. 5, 1972, Jan. 6, 1976 and Feb. 21, 1978, respectively, and entitled "FOUR QUADRANT MULTIPLIER CIRCUIT," "WIDEBAND DIFFERENTIAL AMPLIFIER" and "WIDEBAND DIFFERENTIAL AMPLIFIER," respectively, describes linearization networks for long-tailed-pair configurations in which first and second forward-biased pre-distortion diodes connect the base electrodes of the first transistor and of the second transistor, respectively, to a common node. In Gilbert's linearization networks either the common node or one of the base electrodes of the first and second transistors is connected to a point of fixed potential, against which input signal is referred. This undesirably impairs the ability of the long-tailed-pair amplifier to accept input signals with large common-mode components and to reject them in its output signal response.

The present invention is directed to a floating linearization network for a long-tailed-pair amplifier, in which the pre-distortion diodes are forward-biased as follows. First and second constant-current generators supply equal currents to the ends of the diodes which are connected to respective ones of the base electrodes of the transistors, and a third constant current generator supplies an opposite polarity current substantially equal to the sum of the equal currents to the common node between the other ends of the diodes. In the drawing:

Each of FIGS. 1–6 is a schematic diagram of a long-tailed-pair amplifier configuration provided with a linearization network, embodying the present invention.

Referring generally to the FIGS. 1–6, NPN transistors Q1 and Q2 are connected in long-tailed-pair configuration, with a first constant current generator means IS1 connecting their joined emitter (common) electrodes to a negative supply voltage (−V) terminal for withdrawing a tail current. The base (input electrodes of Q1 and Q2 are connected to input signal terminals T1 and T2, respectively, for receiving input signal voltages. Voltage source VS1 and resistor R1 serially connected between ground and T1 are the Thevenin equivalent of any input signal generating means used for applying input signal voltage to T1; and voltage source VS2 and resistor R2 serially connected between ground and T2 are the Thevenin equivalent of any input signal generating means used for applying input signal voltage to T2. Q1 and Q2 are shown as having their collector (output) electrodes connected to a positive supply voltage (+V) terminal via load means LM1 and LM2, respectively, though one of the collector electrodes may instead be connected directly without substantial intervening impedance to such a terminal, as known.

Figure 2:
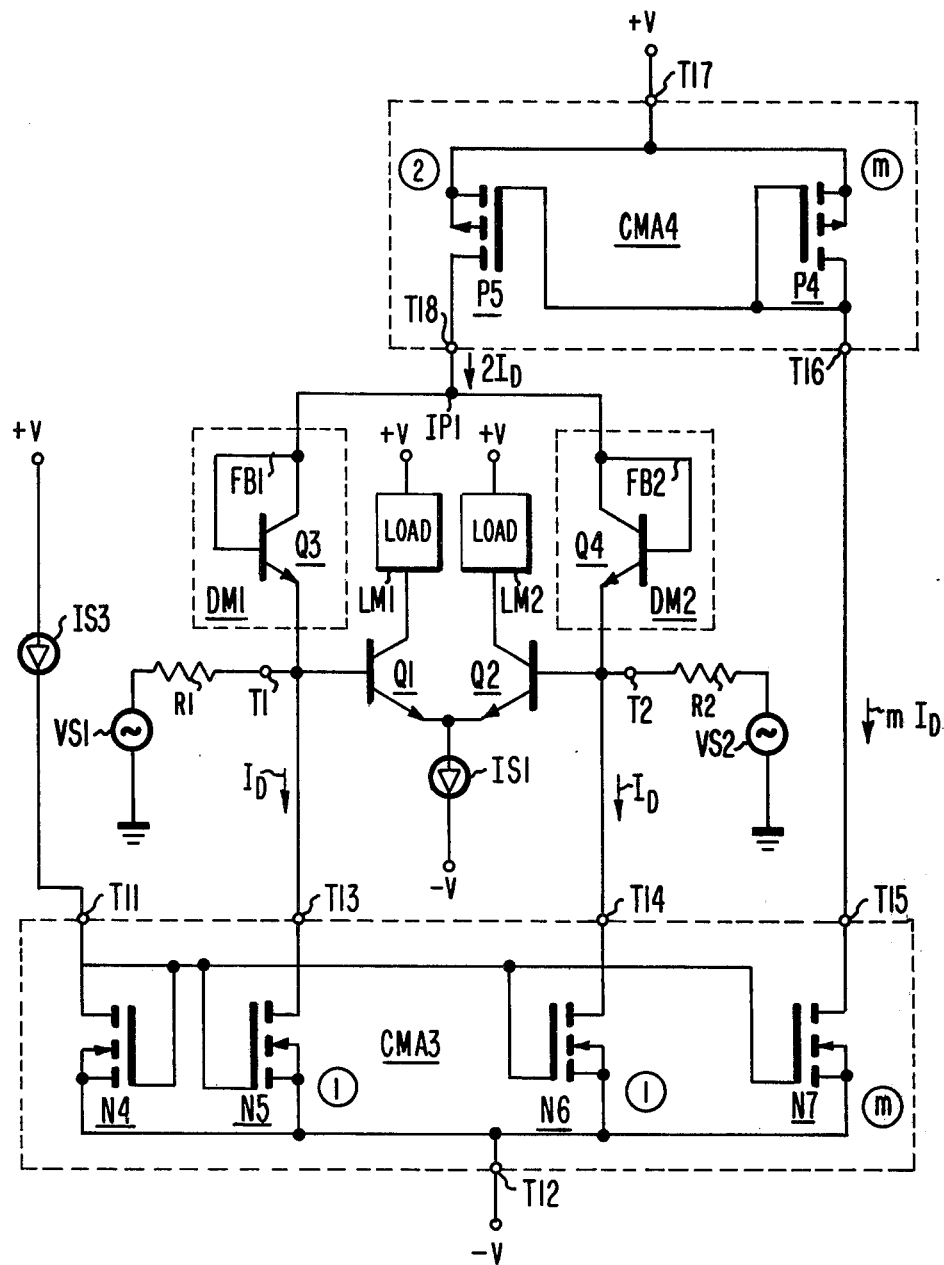
Figure 3:
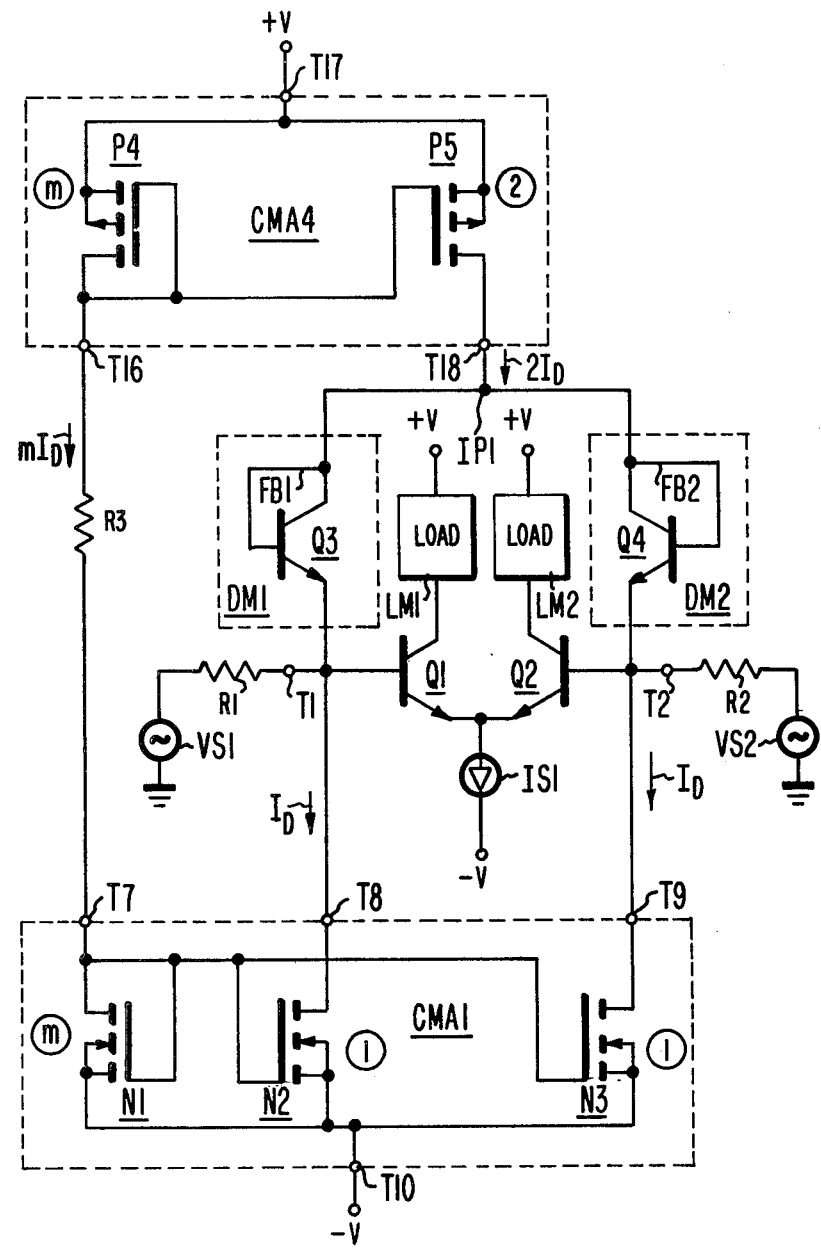

In FIGS. 1–3 NPN transistor Q3 is provided with a direct-coupled feedback connection FB1 from collector to base for conditioning it to operate as a diode means DM1 having an anode connected to a point of interconnection IP1 and having a cathode connected to terminal T1; and NPN transistor Q4 is provided with a direct-coupled feedback connection FB2 from collector to base for conditioning it to operate as a diode means DM2 having an anode connected to point of interconnection IP1 and having a cathode connected to terminal T2. Diode means DM1 and DM2 apportion between them, as respective forward-bias currents, a current of magnitude $2I_D$ applied from current source means having a relatively very high source impedance to the point of interconnection IP1 between their anodes. Under quiescent conditions where the potentials at terminals T1 and T2 are equal-valued, this current of $2I_D$ magnitude will divide equally between diode means DM1 and DM2. The quiescent forward bias currents of magnitude $I_D$ are prevented from affecting the base biasing of Q1 and Q2 by using current sink means with relatively very high impedance to extract currents of magnitude $I_D$ from the node at which the cathode of DM1 and base of Q1 connect and from the node at which the cathode of DM2 and base of Q2 connect. Because of the relatively very high impedances presented to the long-tailed-pair connection of Q1 and Q2 by the current source means supplying the $2I_D$ current to IP1 and the current sink means withdrawing the $I_D$ currents from the cathodes of DM1 and DM2, the linearizing network provided by forward-biased diode means DM1 and DM2 presents no substantial impediment to change in the common-mode component of the voltages at terminals T1 and T2, which change occurs, responsive to changes in the common-mode components of the signal voltages supplied by voltage sources VS1 and VS2.

Insofar as the differential-mode components of input signal supplied to terminals T1 and T2 are concerned, the mode of operation is similar to that described by Gilbert. The resistances the forward biased back-to-back diode means DM1 and DM2 offer between terminals T1 and T2 are inversely related to $I_D$. Where resistances of R1 and R2 are appreciable and the variations in the input signals from voltage sources VS1 and VS2 are small, so that the input signal currents flowing between terminals T1 and T2 are considerably smaller than $I_D$, R1 and R2 will cooperate with forward-biased diodes means DM1 and DM2 to form a potential divider, or potential attenuator. Increasing $I_D$ will increase the attenuation of this attenuator. So, by controlling $I_D$, one may adjust the amplitude of signal voltage excursions at terminals T1 and T2. The logarithmic voltage versus current characteristics of diode means DM1 and DM2 extending over several decades of current tend to pre-distort the input signal voltages at terminals T1 and T2 to compensate for the exponential transconductance characteristics of bipolar transistors Q1 and Q2, linearizing the current gain of the long-tailed-pair connection of Q1 and Q2 when the resistances of R1 and R2 are appreciably large as compared to the resistances the back-to-back, forward-biased diode means DM1 and DM2 offer between terminals T1 and T2.

The problem at this juncture is how to scale the $2I_D$ current supplied to point of interconnection IPI and the $I_D$ currents withdrawn from the nodes to which the base electrodes of Q1 and Q2 connect, since the 2:1:1 ratio between these currents must be strictly adhered to so that no substantial portion of the forward-bias current in diode means DM1 and DM2 flows to affect the operation of the long-tailed-pair connection of Q1 and Q2 adversely. The present inventor has discovered that current mirror amplifiers can perform this task.

As used herein, the term "current mirror amplifier" (or CMA) means a linear inverting current amplifier of the kind comprising: current-to-voltage converter means responsive to the amplifier input current for producing a voltage; a voltage-to-current converter means responsive to said voltage for producing the amplifier output current and wherein each converter means exhibits a respective current/voltage characteristic, which may be non-linear, said characteristics being related by a factor G independent of the magnitude of the current being amplified and being selected to track each other with changes in temperature for providing an overall amplifier gain wherein the ratio of output current to input current magnitudes equals the factor G over substantial ranges of both temperature and the magnitude of the amplified current. It is also desired in the present invention that the factor G be independent of the voltage appearing across the output circuit of the CMA, inasmuch as this voltage will vary depending upon the common-mode component of the voltages supplied by VS1 and VS2. Also, to prevent current drain on the circuitry connected to input terminals T1 and T2, the CMA's should be of a type wherein there is substantially no departure in the gain factor G from nominal design value, such as owing to the base current requirements of bipolar CMA transistors. These design objectives can be met with sophisticated and rather complex CMA designs using bipolar transistors.

However, a simpler CMA configuration is possible using enhancement-mode metal-oxide-semiconductor field effect transistors (MOSFET's). MOSFETS of a type having deeply diffused or implanted drain extensions simulate longer channels and thus make the factor G substantially independent of the voltage appearing across the current mirror amplifier output circuit. In this configuration a master mirroring transistor and one or more slave mirroring transistors are fabricated by the same series of steps as field effect transistors on a monolithic die. The drain electrode of the master transistor is connected to the input terminal of the CMA, and the drain electrode of each slave mirroring transistor is connected to a respective output terminal of the CMA. The source electrodes of all the mirroring transistors are connected to the common terminal of the CMA. Direct-coupled drain-to-gate feedback adjusts the gate potential of the master mirroring transistor to condition the channel between its drain and source electrodes to conduct all the current applied to the CMA input terminal. The source-to-gate potential of the master mirroring transistor is applied as the source-to-gate potential of each of the slave mirroring transistors to cause a current flow through the channel of each slave mirroring transistor which is related to the input current in the same ratio as the source-to-drain current ($I_{DS}$) versus source-to-gate potential ($V_{GS}$) characteristic of the slave mirroring transistor is related to the $I_{DS}$ versus $V_{GS}$ characteristic of the master mirroring transistor. The $I_{DS}$ versus $V_{GS}$ characteristics of two MOSFET's fabricated by the same series of processing steps are related as their channel width to channel length (W/L) ratios, as well known. The preferred embodiments of the present invention use this type of CMA.

In FIG. 1 the $2I_D$ current for application to point of interconnection IP1 is supplied from a first output terminal T3 of a plural-output current mirror amplifier CMA1 responsive to an input current withdrawn from the input terminal T4 of CMA1 by a current source IS2 connected to sink current. CMA1 has a common terminal T5 connected to a positive supply voltage (+V) terminal and has a second output terminal T6 at which an output current $mI_D$, proportionally related to $2I_D$ by a factor (m/2), where m is a positive number, is available. Another plural output current mirror amplifier CMA2 has its input terminal T7 connected to receive the current $mI_D$. The current gains of CMA2 are chosen such that CMA2 responds to the current $mI_D$ to demand currents of $I_D$ magnitude at its first output terminal T8 and its second output terminal T9. The common terminal T10 of CMA2 is connected to a negative supply voltage (−V) terminal.

While CMA1 and CMA2 may be realized in more than one form, they are shown as constituting the simple configuration using the MOSFET's with deep drain extensions alluded to above. In CMA1 p-channel MOSFET P1 is connected as the master-mirroring transistor, and p-channel MOSFET's P2 and P3 are connected as slave mirroring transistors having respective $I_{DS}$ versus $V_{GS}$ characteristics in 2:m ratio for various levels of $V_{GS}$, as indicated by the encircled figures near their respective source electrodes. In CMA2 n-channel MOSFET N1 is connected as the master mirroring transistor, and n-channel MOSFET's N2 and N3 are connected as slave mirroring transistors having similar $I_{DS}$ versus $V_{GS}$ characteristics, each in 1:m ratio to the $I_{DS}$ versus $V_{GS}$ characteristic of N1 for various levels of $V_{GS}$.

In FIG. 2 a current source IS3 supplies a positive current for programming the quiescent $I_D$ current levels through diode means DM1 and DM2, as contrasted to FIG. 1 wherein negative current supplied by IS2 programs the quiescent $I_D$ current levels. This positive current is applied to the input terminal T11 of current mirror amplifier CMA3 which includes a master mirroring transistor N4 and slave mirroring transistors N5, N6, and N7, all of which transistors are n-channel MOSFET's having deep drain extensions, and having their source electrodes connected via the common terminal T12 of CMA3 to a negative operating potential (−V). N5, N6, and N7 have $I_{DS}$ versus $V_{GS}$ characteristics in 1:1:m ratio for various levels of $V_{GS}$, m being a positive number, N5 and N6 respond to the current supplied by current source IS3 to demand equal drain currents of value $I_D$ at output terminals T13 and T14, respectively, of CMA3; and N7 responds to demand a drain current of m times $I_D$ at a further output terminal T15 of CMA3.

This current, $mI_D$, is withdrawn from the input terminal T16 of a current mirror amplifier CMA4, which is constructed with p-channel deep-drain-extension MOSFET's P4 and P5. P4 and P5 have their source electrodes connected to a positive operating potential (+V) via the common terminal T17 of CMA4. P4 is connected as the master mirroring transistor of CMA4, and P5 is connected as the slave mirroring transistor. The $I_{DS}$ versus $V_{GS}$ characteristics of P4 and P5 are in m:2 ratio for various levels of $V_{GS}$, so P5 supplies a current of $2I_D$ at output terminal T18 to point of interconnection IP1 responsive to the $mI_D$ current withdrawn from input terminal T16 of CMA4.

FIG. 3 shows the use of CMA2 for withdrawing currents of magnitude $I_D$ from the cathodes of diode means DM1 and DM2, respectively, and the use of CMA4 for supplying a $2I_D$ current to point of interconnection IP1 when a source of programming current is available which floats with respect to the negative and positive operating potentials $-V$ and $+V$ and with respect to ground. FIG. 3 shows a particular embodiment of this species of the present invention in which the floating current source is a resistive element R3 connecting the respective input terminals T7 and T16 of CMA1 and CMA4.

Figure 4:
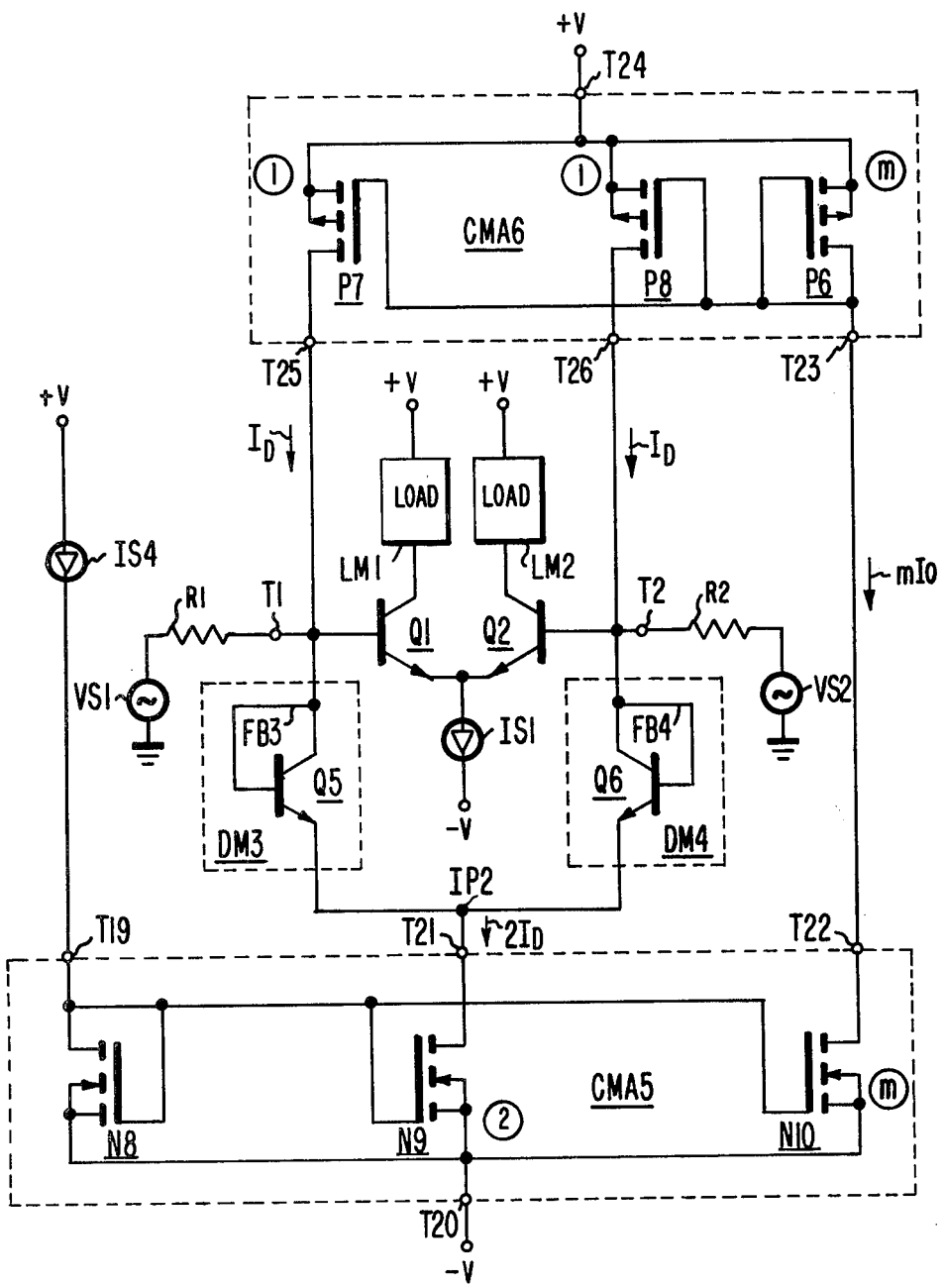
Figure 5:
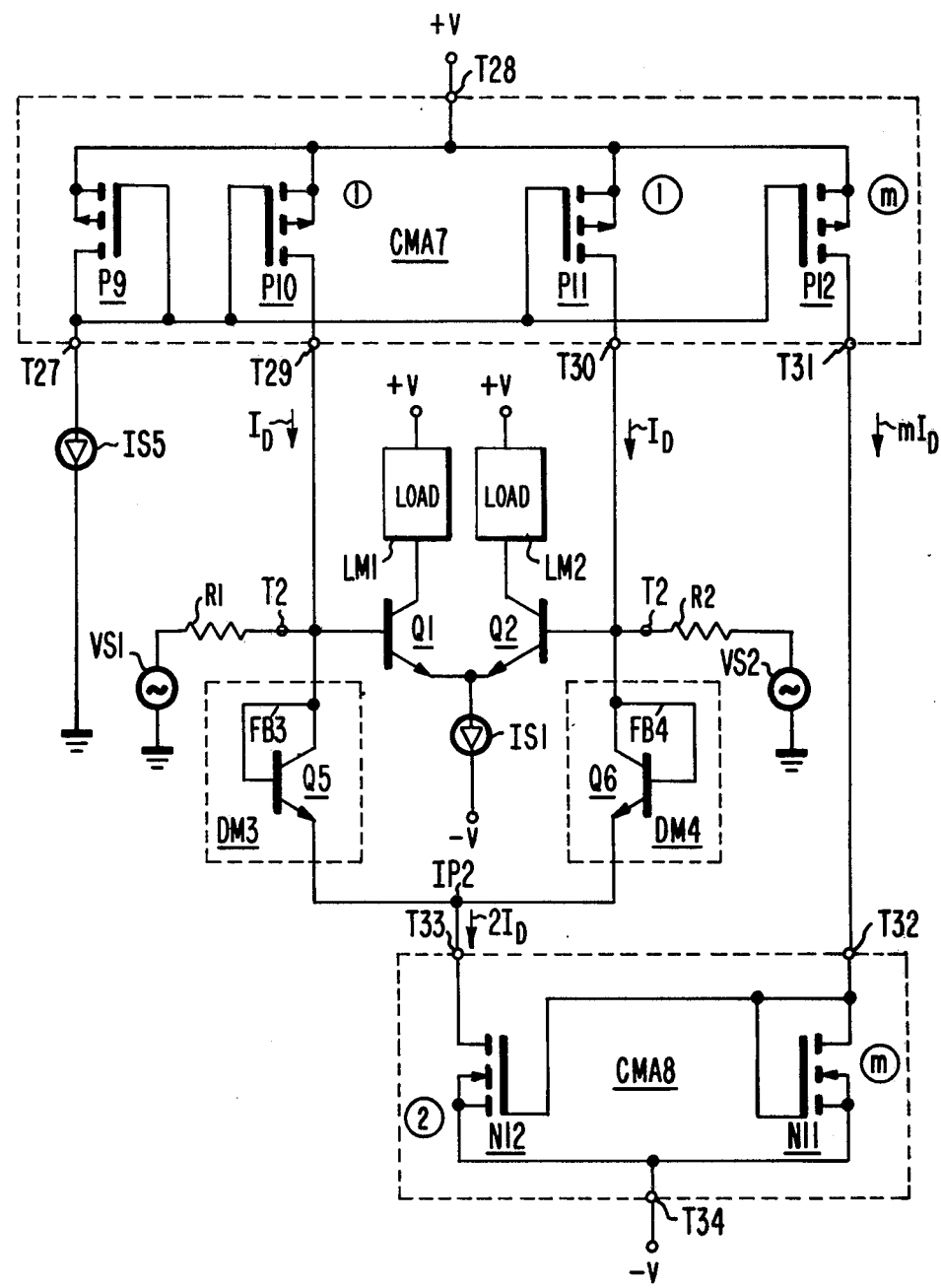
Figure 6:
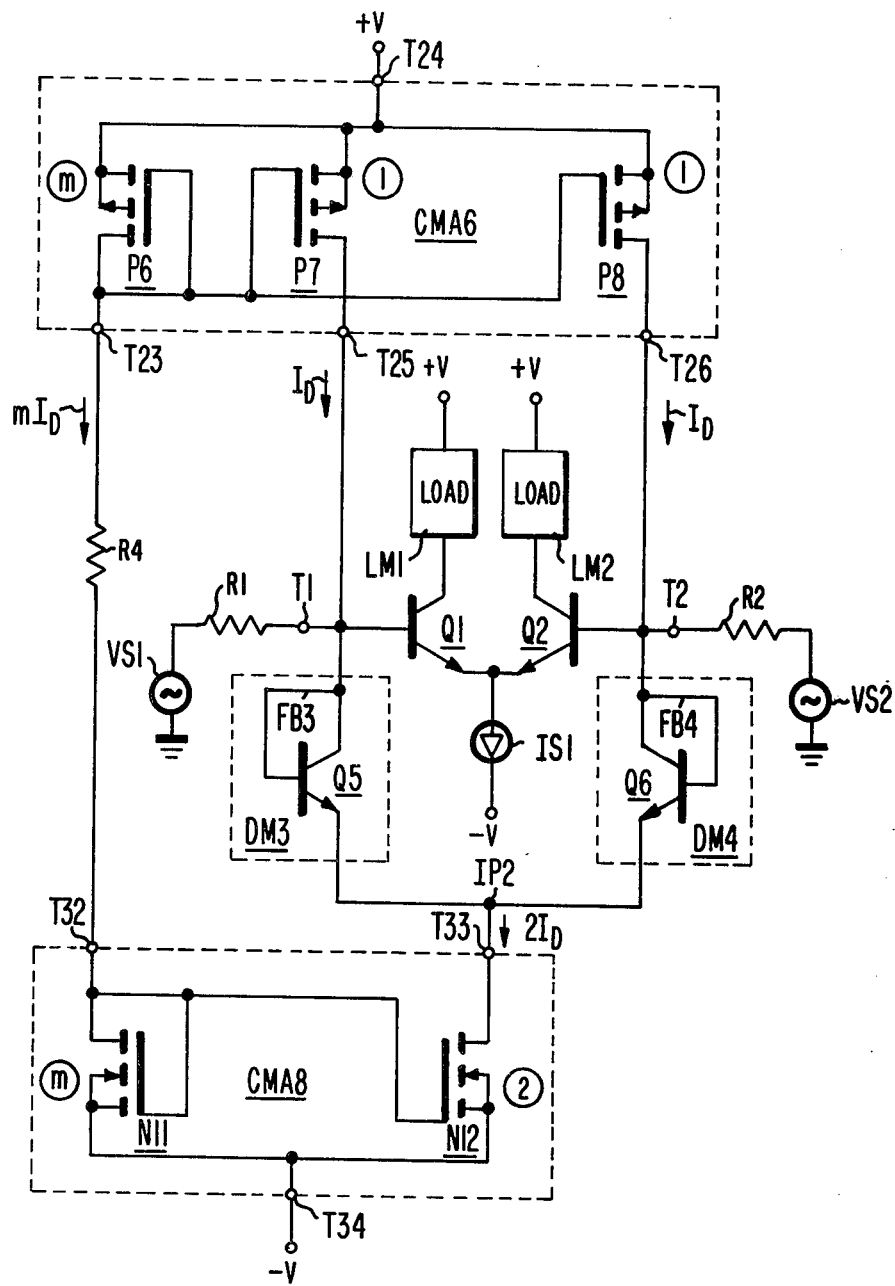

In FIGS. 4–6 NPN transistors Q5 and Q6 are provided with respective direct-coupled feedback connections FB3 and FB4 to operate them as diode means DM3 and DM4, respectively. These diode means DM3 and DM4 have their respective cathodes connected together at a point of interconnection IP2 from which a current of magnitude $2I_D$ is withdrawn, and quiescent currents each of magnitude $I_D$ are supplied to their respective anodes respectively connected to terminal T1 and to terminal T2 at the base electrodes of Q1 and Q2 respectively.

The means for withdrawing the $2I_D$ current and supplying the two $I_D$ currents in FIGS. 4, 5 and 6 respectively are similar to the means for supplying a $2I_D$ current and withdrawing two $I_D$ currents in FIGS. 1, 2 and 3, respectively, except for the conductivity types of transistor and appropriate reversal of power supply connections and programming current polarity. More particularly, in FIG. 4 CMA5 with input terminal T19, common terminal T20 connected to a negative operating potential $-V$, n-channel MOSFET N8 connected as master mirroring transistor with drain and source electrodes connected respectively to T19 and T20, n-channel MOSFET's N9 and N10 connected as slave mirroring transistors with $I_{DS}$ versus $V_{GS}$ characteristics in 2:m ratio for various levels of $V_{GS}$, and output terminals T21 and T22 to which the drain electrodes of N9 and N10 respectively connect, functions analogously to CMA1 of FIG. 1. CMA5 responds to the positive current supplied from current source IS4 to its input terminal T19 to demand a current of magnitude $2I_D$ at its output terminal T21 connected to point of interconnection IP2 and to demand a current of magnitude $mI_D$ at its output terminal T22 connected to the input terminal T23 of a current mirror amplifier CMA6. CMA6 includes p-channel MOSFET P6 connected as a master mirroring transistor and p-channel MOSFET's P7 and P8 connected as slave mirroring transistors. The source electrodes of P6, P7 and P8 are connected to a positive operating potential $+V$ via common terminal T24 of CMA6, and their drain electrodes are respectively connected to input terminal T23, output terminal T24 and output terminal T25 of CMA6. Like CMA2 of FIG. 1, CMA6 responds to current of magnitude $mI_D$ applied to its input terminal with currents of magnitude $I_D$ from each of its output terminals, although the currents involved are of opposite polarity.

In FIG. 5 CMA7 has an input terminal T27 from which a positive current is withdrawn by current source IS5 connected to sink current; has a p-channel MOSFET P9 connected as its master mirroring transistor; has p-channel MOSFET's P10, P11, and P12, with respective $I_{DS}$—versus—$V_{GS}$ characteristics in 1:1:m ratio for various levels of $V_{GS}$, connected as slave mirroring transistors; has a common terminal T28 via which the source electrodes of P9, P10, P11 and P12 are connected to a positive operating potential $+V$; and has output terminals T29, T30, and T31 to which the drain electrodes of P10, P11, and P12 respectively connect for supplying currents of magnitudes $I_D$, $I_D$, and $MI_D$, respectively. The currents of magnitude $I_D$ supplied from terminals T29 and T30 are applied to the anodes of diode means DM3 and DM4, respectively. A current mirror amplifier CMA8 receives the current of magnitude $MI_D$ at its input terminal T32 and responds to withdraw a current of magnitude $2I_D$ at its output terminal T33 from point of interconnection IP2. CMA8 includes n-channel MOSFET's N11 and N12 having respective $I_{DS}$—versus—$V_{GS}$ characteristics in m:2 ratio for various levels of $V_{GS}$, having respective drain electrodes connected to the input terminal T32 and output terminal T33 of CMA8, having respective source electrodes connected to the common terminal T34 of CMA8, and being respectively connected as master and slave mirroring transistors of CMA8.

FIG. 6 shows the use of CMA6 for supplying currents of magnitude $I_D$ to the anodes of diode means DM3 and DM4, respectively, and the use of CMA8 for withdrawing a current of magnitude $2I_D$ from point of interconnection IP2 when a floating source of programming current is available. FIG. 6 shows this current source as consisting of resistive element R4 connecting the respective input terminals T23 and T32 of CMA6 and of CMA8.

current sources IS2, IS3, IS4 and IS5 may each comprise a resistive element, of fixed resistance if a fixed value of $I_D$ is desired and the operating potentials $V+$ and $V-$ are each of fixed value. Alternatively, any one of these current sources or R3 or R4 may be replaced by an adjustable current source of one of the known types or an adjustable resistor.

What I claim is:

1. In combination with a long-tailed-pair amplifier including first and second transistor means of the same conductivity type as each other, each of which has respective input and output and common electrodes, and first constant current generator means connected to a point to which the common electrodes of said first and second transistors are connected without substantial intervening impedance, for determining the flow of tail current through that point, a circuit for linearizing the transconductance of said long-tailed-pair amplifier comprising:

first and second diode means each having first and second electrodes between which conduction in a first direction is relatively easy and conduction in a second direction opposite to the first is relatively difficult, the first electrode of said first diode means connected without substantial intervening impedance to the input electrode of said first transistor means, the first electrode of said second diode means connected without substantial intervening impedance to the input electrode of said second transistor means, the second electrodes of said diode means each connected without substantial intervening impedance to a point of interconnection;

second constant current generator means connected for applying a current to said point of interconnection, which current is of a magnitude $2I_D$ and of a first polarity, tending to forward bias said first and second diode means;

third constant current generator means connected for applying a current to the first electrode of said first diode means, which current is of a magnitude $I_D$ and of a second polarity opposite to said first polarity; and fourth constant current generator means connected for applying a current to the first electrode of said second diode means, which current is of a magnitude $I_D$ and of said second polarity.

2. The combination as set forth in claim 1 wherein said first diode means includes:

a third transistor means of the same type as said first transistor, said third transistor means having input and output and common electrodes, its output and common electrodes connected at separate ones of the first and second electrodes of said first diode means; and means for applying a potential to the input electrode of said third transistor means equal to the potential at its output electrode.

3. The combination as set forth in claim 2 wherein said second diode means includes:

a fourth transistor means of the same type as said second transistor, said fourth transistor means having input and output and common electrodes, its output and common electrodes connected at separate ones of the first and second electrodes of said second diode means; and means for applying a potential to the input electrode of said fourth transistor means equal to the potential at its output electrode.

4. The combination as set forth in claim 1 wherein said second, third, and fourth constant current generators together comprise:

first and second supply terminals for receiving an operating potential therebetween;

third and fourth transistor means of a conductivity type complementary to that of said first and second transistor means, said third and fourth transistor means having respective input and output and common electrodes, the output electrode of said third transistor means being connected to said point of interconnection, and the common electrodes of said third and fourth transistor means being connected to said first supply terminal;

means applying a bias potential to the input electrodes of said third and fourth transistor means;

a plural-output current mirror amplifier having an input terminal to which the output electrode of said fourth transistor means is connected, having a first output terminal connected to the first electrode of said first diode means, having a second output terminal connected to the first electrode of said second diode means, and having a common terminal connected to said second supply terminal.

5. The combination as set forth in claim 1 wherein said second, third, and fourth constant current generator means together comprise:

first and second supply terminals for receiving an operating potential therebetween;

current source means for supplying an input current;

first and second-plural output current mirror amplifiers of complementary conductivity types, having respective input terminals, having respective common terminals respectively connected to said first supply terminal and to said second supply terminal, and having respective first and second output terminals, the input terminal of said first current mirror amplifier being connected to receive said input current from said current source means, the first output terminal of said first current mirror amplifier being connected to said point of interconnection for supplying said current of magnitude $2I_D$ and of said first polarity, the second output terminal of said first current mirror amplifier being connected to the input terminal of said second current mirror amplifier, the first and second output terminals of said second current mirror amplifier being respectively connected to the first electrode of said first diode means and to the first electrode of said second diode means for supplying respective ones of said currents of magnitude $I_D$ and of said second polarity.

6. The combination as set forth in claim 1 wherein said second, third, and fourth constant current generator means together comprise:

first and second supply terminals for receiving an operating potential therebetween;

a current mirror amplifier having an input terminal, having an output terminal connected to said point of interconnection, and having a common terminal connected to said first supply terminal;

third and fourth and fifth transistor means of similar conductivity type to said first and second transistor means, each having respective input and output and common electrodes, the output electrodes of said third and fourth transistor means respectively connected to the first electrode of said first diode means and to the first electrode of said second diode means, the output electrode of said fifth transistor means connected to the input terminal of said current mirror amplifier, the common electrodes of said third and fourth and fifth transistor means being connected to said second supply terminal; and means for applying a bias potential to the input electrodes of said third and fourth and fifth transistor means.

7. The combination as set forth in claim 1 wherein said second, third and fourth constant current generator means together comprise:

first and second supply terminals for receiving an operating potential therebetween;

current source means for supplying an input current;

a first, plural-output current mirror amplifier having an input terminal connected to receive said input current from said current source means, having first and second output terminals respectively connected to the first electrode of said first diode means and to the second electrode of said second diode means for supplying respective ones of said currents of magnitude $I_D$ and of said second polarity, having a third output terminal, and having a common terminal connected to said second supply terminal;

a second current mirror amplifier of a conductivity type complementary to that of said first current mirror amplifier, having an input terminal to which the third output terminal of said first current mirror amplifier connects, having a common terminal connected to said first supply terminal, and having an output terminal connected to said point of interconnection for supplying said current of magnitude $2I_D$ and of said first polarity.

8. The combination as set forth in claim 1 wherein said second, third, and fourth constant current generator means together comprise:
first and second supply terminals for receiving an operating potential therebetween;
a first current mirror amplifier having an input terminal, having a common terminal connected to said first supply terminal, and having an output terminal connected to said point of interconnection;
a second, plural-output current mirror amplifier of a conductivity type complementary to that of said first current mirror amplifier, having an input terminal, having a common terminal connected to said second supply terminal, and having first and second output terminals respectively connected to the first electrode of said first diode means and to the first electrode of said second diode means; and
means connected between the input terminals of said first and second current mirror amplifiers for causing a current flow between them.

* * * * *